US010732346B2

(12) United States Patent
Lee et al.

(10) Patent No.: US 10,732,346 B2
(45) Date of Patent: Aug. 4, 2020

(54) BACKLIGHT UNIT AND DISPLAY DEVICE INCLUDING THE SAME

(71) Applicant: SAMSUNG DISPLAY CO., LTD., Yongin-Si, Gyeonggi-Do (KR)

(72) Inventors: Jee-Na Lee, Anyang-Si (KR); Hyun-Hyang Kim, Suwon-Si (KR); Hyeonmi Lee, Tongyeong-Si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 16/225,692

(22) Filed: Dec. 19, 2018

(65) Prior Publication Data

US 2019/0187362 A1 Jun. 20, 2019

(30) Foreign Application Priority Data

Dec. 20, 2017 (KR) .................. 10-2017-0176391

(51) Int. Cl.
*G02B 6/00* (2006.01)
*F21V 8/00* (2006.01)
*H05K 1/18* (2006.01)

(52) U.S. Cl.
CPC ......... *G02B 6/0068* (2013.01); *G02B 6/0073* (2013.01); *G02B 6/0083* (2013.01); *G02B 6/0091* (2013.01); *G02B 6/0093* (2013.01); *H05K 1/189* (2013.01); *H05K 2201/10106* (2013.01)

(58) Field of Classification Search
CPC .. G02B 6/0068; G02B 6/0073; G02B 6/0091; G02B 6/0093

USPC ......................................... 362/97.1
See application file for complete search history.

(56) References Cited

U.S. PATENT DOCUMENTS

| 7,390,108 | B1* | 6/2008 | Wang | G02F 1/133603 |
| | | | | 362/249.16 |
| 7,543,970 | B2* | 6/2009 | Kiyohara | G02B 6/0031 |
| | | | | 362/561 |
| 8,167,476 | B2 | 5/2012 | Sakamoto et al. | |
| 8,342,730 | B2 | 1/2013 | Tsubaki | |
| 8,477,262 | B2* | 7/2013 | Park | G02B 6/0091 |
| | | | | 349/65 |
| 8,727,595 | B2* | 5/2014 | Lai | G02B 6/0031 |
| | | | | 362/23.09 |
| 9,070,845 | B2 | 6/2015 | Kim et al. | |
| 9,316,381 | B2* | 4/2016 | Kweon | G02B 6/0091 |
| 9,651,206 | B2 | 5/2017 | Vasta et al. | |
| 9,958,590 | B2* | 5/2018 | Teragawa | G02B 6/0031 |

(Continued)

FOREIGN PATENT DOCUMENTS

| JP | 4618310 | 1/2011 |
| JP | 4973213 | 7/2012 |

(Continued)

*Primary Examiner* — Christopher M Raabe
(74) *Attorney, Agent, or Firm* — F. Chau & Associates, LLC

(57) ABSTRACT

A display device includes a display panel and a backlight unit. The backlight unit includes a light source that includes a printed circuit board and a plurality of light emitting diode packages mounted on the printed circuit board, a light guiding member in contact with the light emitting diode packages, and a protection member. The protection member is disposed between and in contact with the light guiding member and the printed circuit board.

20 Claims, 16 Drawing Sheets

(56) References Cited

U.S. PATENT DOCUMENTS

| | | | |
|---|---|---|---|
| 10,191,206 B2* | 1/2019 | Choi | H05K 1/189 |
| 2005/0141244 A1* | 6/2005 | Hamada | G02B 6/0068 |
| | | | 362/612 |
| 2009/0316064 A1* | 12/2009 | Kono | G02B 6/009 |
| | | | 349/58 |
| 2011/0285937 A1* | 11/2011 | Onoue | G02B 6/009 |
| | | | 349/62 |
| 2012/0236207 A1 | 9/2012 | Fukuda | |
| 2017/0261676 A1* | 9/2017 | Teragawa | G02B 6/0031 |

FOREIGN PATENT DOCUMENTS

| | | |
|---|---|---|
| JP | 2012189914 | 10/2012 |
| KR | 1020120072958 | 7/2012 |
| KR | 1020130067685 | 6/2013 |

\* cited by examiner

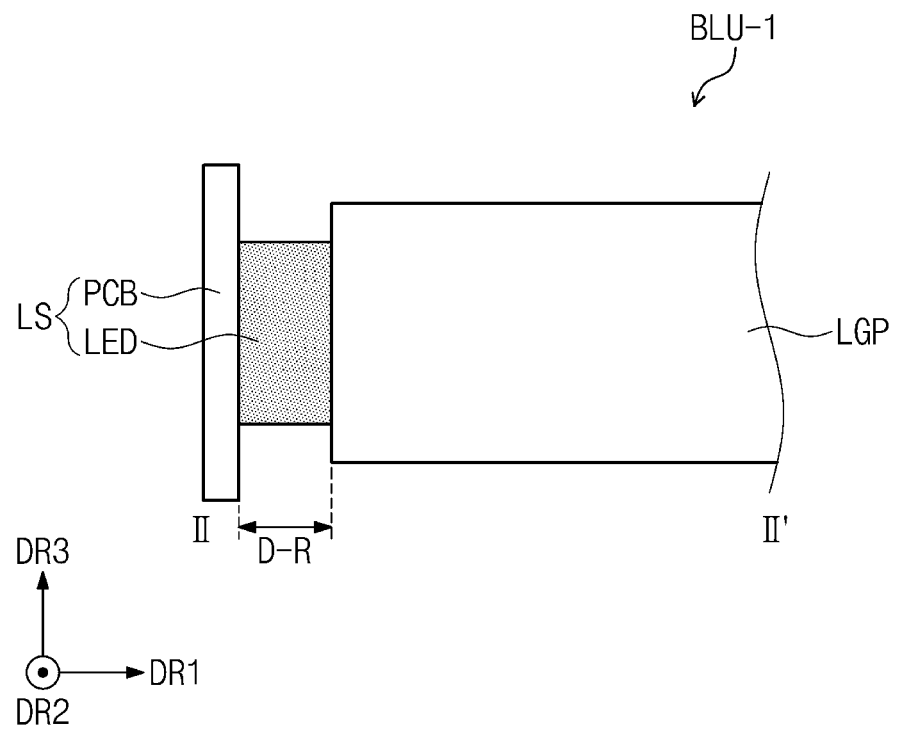

BACKLIGHT UNIT AND DISPLAY DEVICE INCLUDING THE SAME

CROSS-REFERENCE TO RELATED APPLICATIONS

This U.S. non-provisional patent application claims priority under 35. U.S.C. § 119 from, and the benefit of, Korean Patent Application No. 10-2017-0176391, filed on Dec. 20, 2017 in the Korean Intellectual Property Office, the contents of which are herein incorporated by reference in their entirety.

BACKGROUND

Embodiments of the present disclosure are directed to a backlight unit and a display device that includes the backlight unit.

For a non-emissive display device such as a liquid crystal display device, there is no self-luminous component, and the non-emissive display device includes a backlight unit to provide light to a display panel.

A backlight unit includes a light source and a light guiding member. The light guiding member guides light emitted from the light source toward the display panel.

There is an increasing demand for a display device that is thin and has a narrow bezel, which decreases distances between internal components. However, if the distances between the internal components are too small, even weak impacts can break portions of the internal components.

SUMMARY

Some embodiments of the inventive concept provide a display device that can prevent a light source of a backlight unit from being broken by an external impact.

Some embodiments of the inventive concept provide a backlight unit that can reduce optical loss that occurs when light is incident into a light guiding member from a light source, and a display device that includes the backlight unit.

According to some embodiments of the inventive concept, a display device includes a display panel that includes a liquid crystal layer and a backlight unit that emits light to the display panel. The backlight unit includes a light source that includes a printed circuit board and a plurality of light emitting diode packages mounted on the printed circuit board, a light guiding member in contact with the light emitting diode packages, and a protection member disposed between and in contact with the light guiding member and the printed circuit board.

In some embodiments, a thickness of each of the light emitting diode packages is substantially equal to that of the protection member.

In some embodiments, the protection member includes a plurality of openings, and each of the light emitting diode packages is inserted into a corresponding opening.

In some embodiments, the protection member includes a base that includes the openings, and a lower support that extends from a first side portion of the base wherein the lower support supports a bottom surface of the light guiding member. The base and the lower support may constitute a single object.

In some embodiments, the protection member furthers include an upper support that extends from a second side portion of the base and contacts a top surface of the light guiding member. The base, the lower support, and the upper support may constitute a single object.

In some embodiments, the display device includes a plurality of protection members, and each of the plurality of protection members is disposed between a corresponding adjacent pair of the light emitting diode packages.

In some embodiments, at least one of the plurality of protection members is mounted on the printed circuit board.

In some embodiments, at least one of the plurality of protection members includes a body portion in contact with the light guiding member, and an adhesive member that attaches the body portion to the printed circuit board.

In some embodiments, at least one of the plurality of protection members includes a body portion in contact with the printed circuit board, and an adhesive member that attaches the body portion to the light guiding member.

In some embodiments, at least one of the plurality of protection members includes a body portion, a first adhesive member that attaches the body portion to the printed circuit board, and a second adhesive member that attaches the body portion to the light guiding member.

In some embodiments, a corner portion of the light guiding member has a chamfered shape.

In some embodiments, the protection member has a shape that corresponds to the chamfered shape.

According to some embodiments of the inventive concept, a backlight unit may include a light source, a light guiding member, and a protection member. The light source includes a printed circuit board and a plurality of light emitting diode packages mounted on the printed circuit board. The light guiding member is in contact with the light emitting diode packages, and the protection member is disposed between and in contact with the light guiding member and the printed circuit board. A thickness of each of the light emitting diode packages is substantially equal to that of the protection member.

According to some embodiments of the inventive concept, a backlight unit may include a light source, a light guiding member, and a protection member. The light source includes a printed circuit board and a plurality of light emitting diode packages mounted on the printed circuit board. The light guiding member includes a front surface and a rear surface that face each other and a plurality of side surfaces that connect the front surface to the rear surface, where at least one of that side surfaces is in contact with the plurality of light emitting diode packages. The protection member is disposed between and in contact with the light guiding member and the printed circuit board.

BRIEF DESCRIPTION OF THE DRAWINGS

FIG. 7 is a sectional view taken along line II-II' of FIG. 6.

Figure 1:
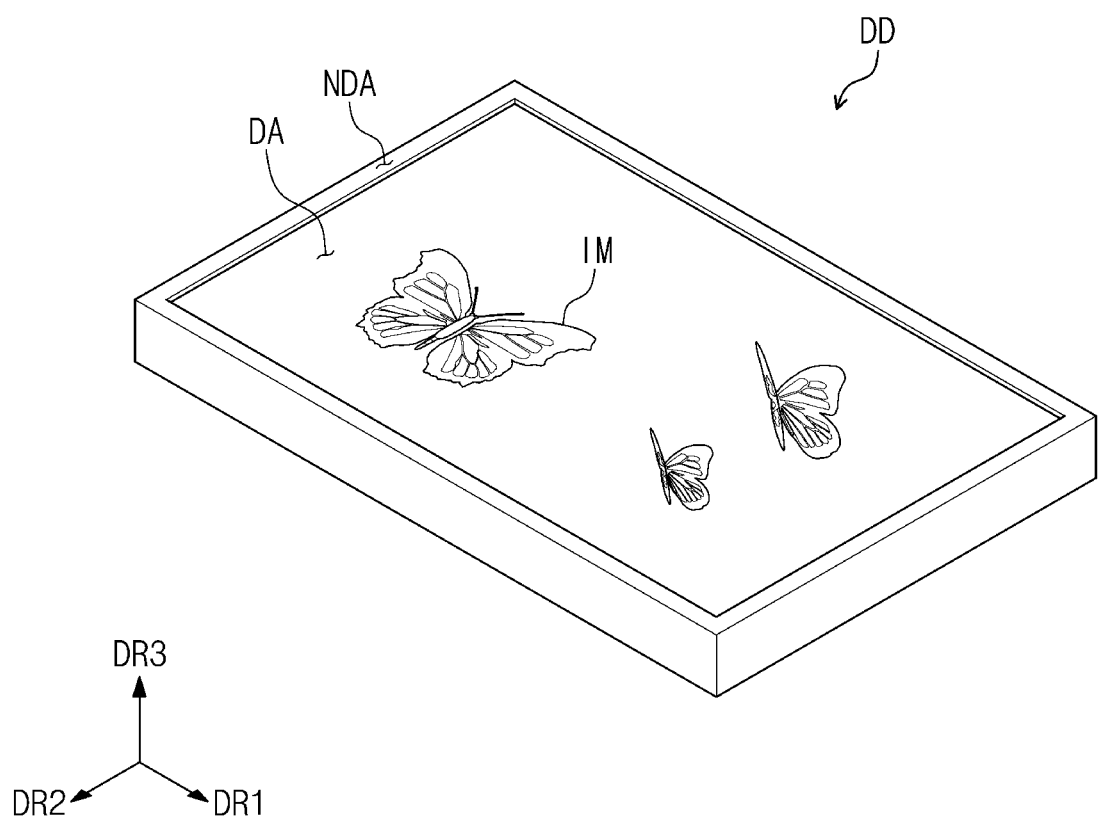
FIG. 1 is a perspective view of a display device according to some embodiments of the inventive concept.

It should be noted that these drawings are not to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of similar or identical elements or features.

DETAILED DESCRIPTION

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the embodiments set forth herein. In the drawings, the thicknesses of layers and regions may be exaggerated for clarity. Like reference numerals in the drawings may denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
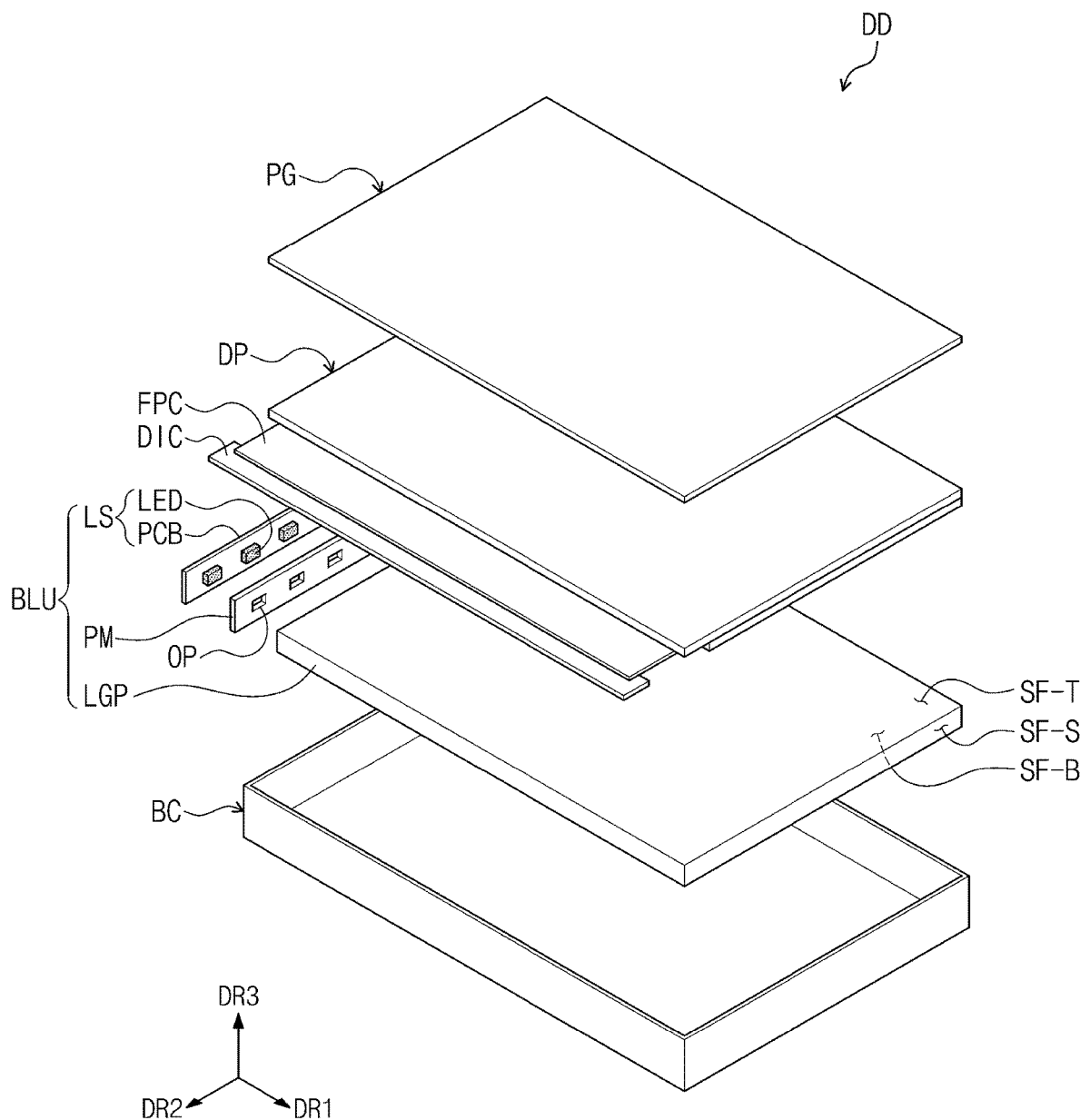
FIG. 2 is an exploded perspective view of an example of a display device of FIG. 1.

FIG. 1 is a perspective view of a display device DD according to some embodiments of the inventive concept. FIG. 2 is an exploded perspective view of an example of a display device DD of FIG. 1.

The display device DD may be a liquid crystal display device, an organic light emitting display device, or a plasma display device. For the sake of simplicity, the description that follows will refer to an example in which the display device DD is a liquid crystal display device.

As shown in FIGS. 1 and 2, according to some embodiments, the display device DD includes a protection glass PG, a display panel DP, a flexible printed circuit board FPC, a driving circuit DIC, a backlight unit BLU, and a bottom cover BC.

According to some embodiments, the display device DD includes a display area DA. The display device DD projects an image IM to a user through the display area DA. Butterflies are shown as an example of the image IM. A non-display area NDA in which no image is displayed surrounds the display area DA.

According to some embodiments, the protection glass PG protects the display panel DP. In certain embodiments, the protection glass PG is replaced with a top cover. The top cover exposes a front surface of the display panel DP by which the display area DA is defined. The edge of the top cover corresponds to the non-display area NDA.

According to some embodiments, the display panel DP controls optical transmittance of light emitted from the backlight unit BLU in response to signals received from the driving circuit DIC through the flexible printed circuit board FPC.

According to some embodiments, the backlight unit BLU provides light to the display panel DP. The backlight unit BLU includes a light source LS, a light guiding member LGP, and a protection member PM.

According to some embodiments, the light source LS includes a printed circuit board PCB and a plurality of light emitting diode packages LED mounted on the printed circuit board PCB. Each of the light emitting diode packages LED includes a light-emitting diode that emits light, and a lens that covers the light-emitting diode.

According to some embodiments, the light guiding member LGP guides light emitted from the light source LS toward the display panel DP. The light guiding member LGP is formed of or includes glass.

According to some embodiments, the light guiding member LGP includes a front surface SF-T, a rear surface SF-B that faces the front surface SF-T, and a plurality of side surfaces SF-S that connect the front and rear surfaces SF-T and SF-B to each other. The light guiding member is placed so that the front surface SF-T and the rear surface SF-B are oriented parallel to a first direction DR1 and a second direction DR2. Each of the side surfaces SF-S extends in a third direction DR3 from an edge of the front or rear surface SF-T or SF-B.

According to some embodiments, the protection member PM is disposed between the light guiding member LGP and the light source LS. The protection member PM can distribute stress exerted on the light source LS and is formed of or includes an impact absorbable material.

In some embodiments, a plurality of openings OP are formed in the protection member PM. Each of the light emitting diode packages LED is inserted into a corresponding opening OP of the protection member PM.

According to some embodiments, the light source LS and the protection member PM are disposed on one of the side surfaces SF-S of the light guiding member LGP, as shown in FIG. 2, but embodiments of the inventive concept are not limited thereto.

Referring to FIG. 2, according to some embodiments, the light source LS emits light into the side surface SF-S of the light guiding member LGP, and the light guiding member LGP guides the light received from the light source LS toward the front surface SF-T from which the light is emitted toward the display panel DP.

According to some embodiments, the bottom cover BC covers the display panel DP and the backlight unit BLU, thereby protecting the display panel DP and the backlight unit BLU from external impacts or contamination materials.

According to some embodiments, a plurality of optical sheets are disposed between the display panel DP and the backlight unit BLU. The optical sheets modify optical characteristics of the light emitted from the backlight unit BLU, and the light modified by optical sheets is emitted to the display panel DP.

Figure 3:
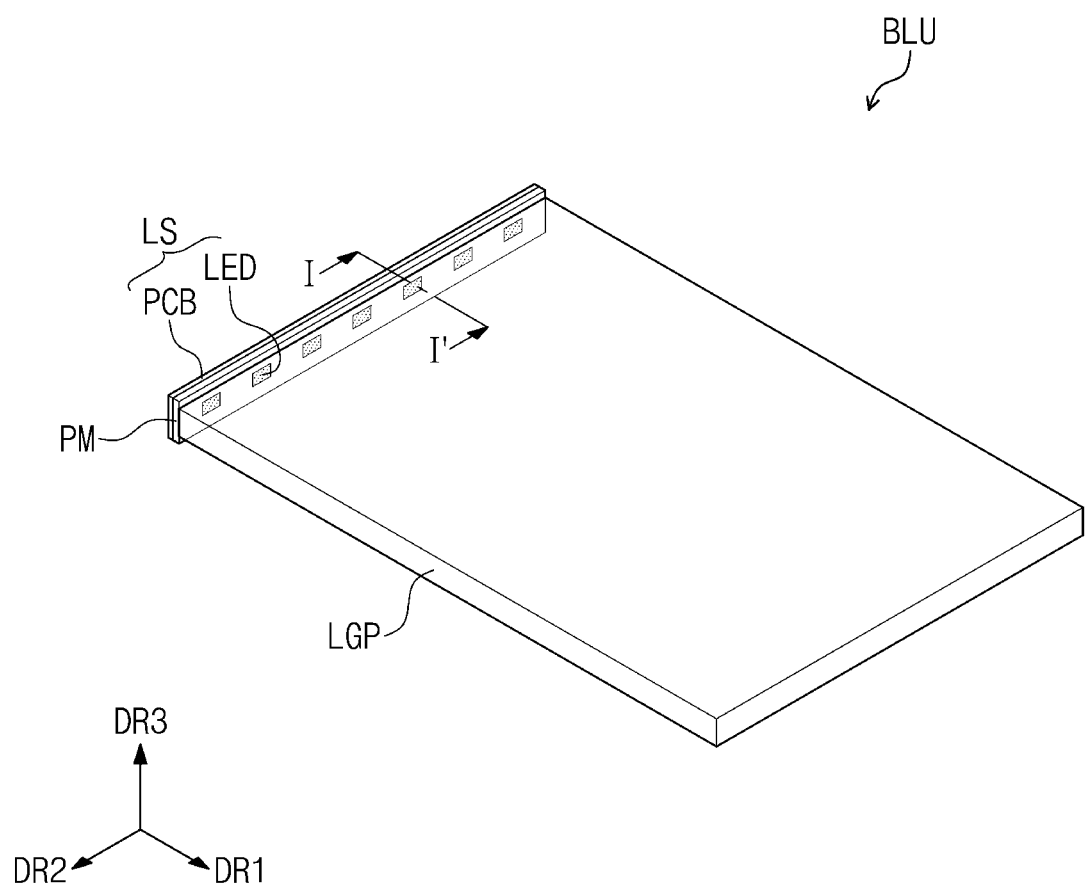
FIG. 3 is a perspective view of a backlight unit of FIG. 2.
Figure 4A:
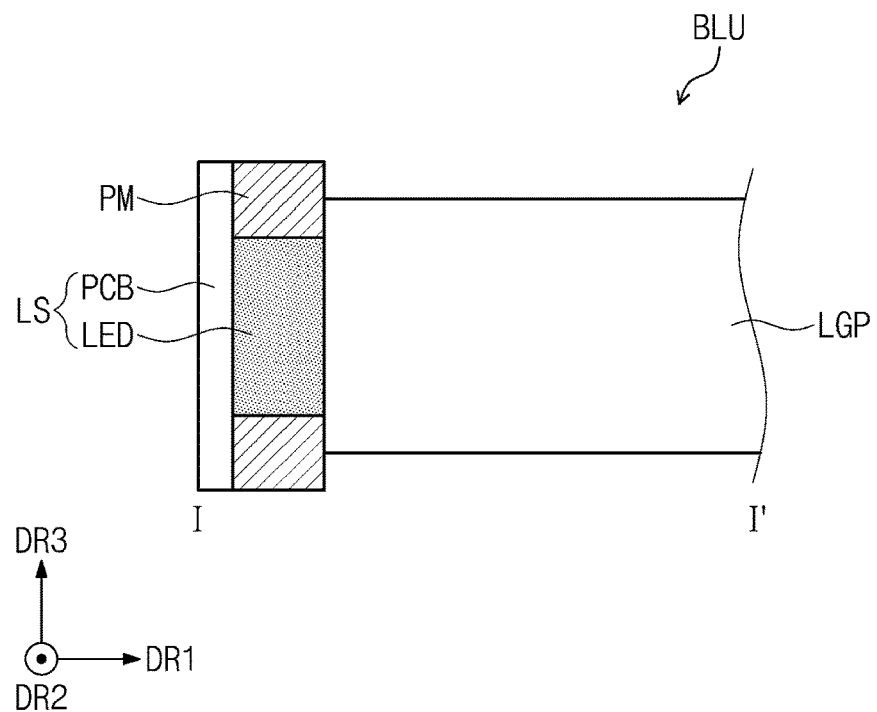
FIGS. 4A, 4B, and 4C are sectional views taken along line I-I' of FIG. 3.
Figure 4B:
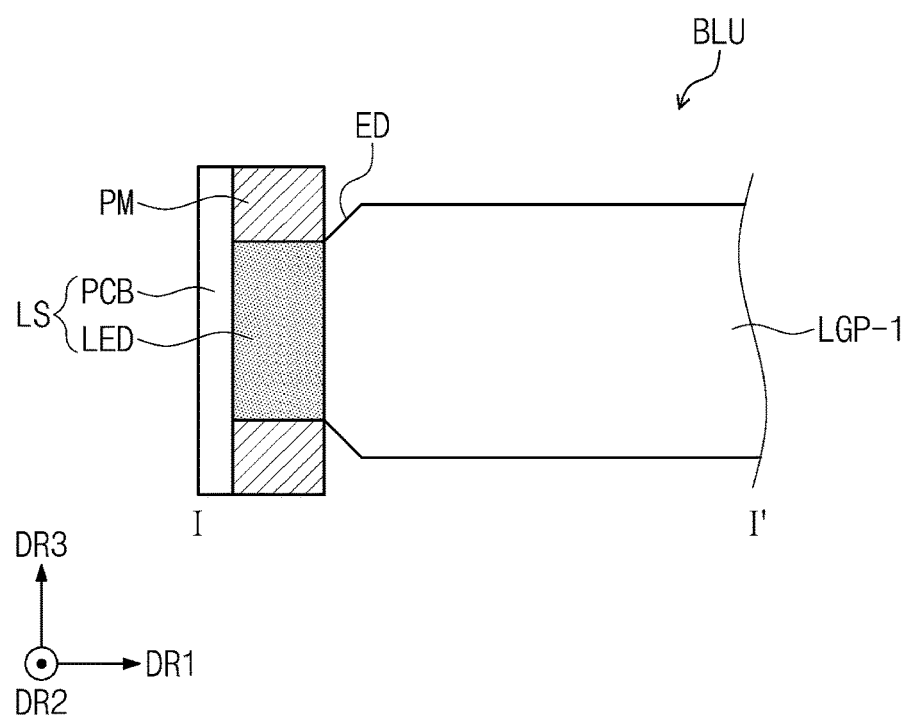
Figure 4C:
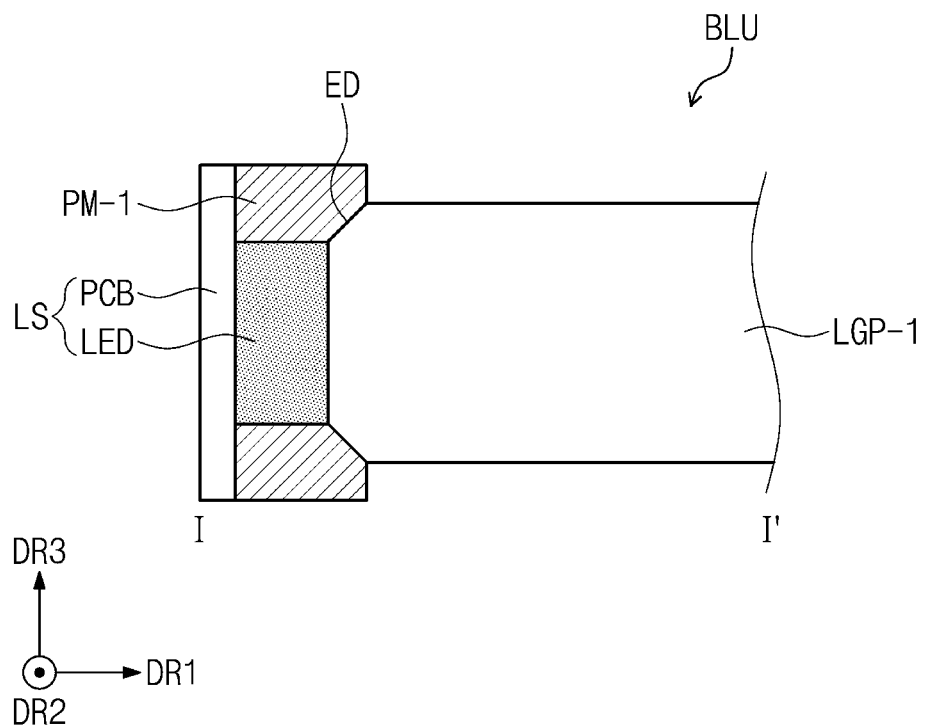

FIG. 3 is a perspective view of a backlight unit BLU of FIG. 2. FIGS. 4A, 4B, and 4C are sectional views taken along line I-I' of FIG. 3.

Referring to FIG. 4A, according to some embodiments, the light emitting diode package LED is in contact with the light guiding member LGP.

According to some embodiments, the protection member PM is in contact with the light guiding member LGP and the printed circuit board PCB.

According to some embodiments, in a case there the light guiding member LGP is spaced apart from the light emitting diode package LED, a fraction of light emitted from the light emitting diode package LED may be lost when incident into the light guiding member LGP. That is, optical loss can occur on a surface of the light guiding member LGP. According to some embodiments of the inventive concept, to reduce such optical loss, the light emitting diode package LED is in contact with the light guiding member LGP, as shown in FIG. 4A.

However, when the light emitting diode package LED is in contact with the light guiding member LGP, the light emitting diode package LED can break due to stress exerted by the light guiding member LGP. The protection member PM can prevent the light emitting diode package LED from being broken by the light guiding member LGP. Owing to the protection member PM, stress exerted on the light emitting diode package LED can be dispersed to prevent the light emitting diode package LED from breaking.

Referring to FIG. 4B, according to some embodiments, the backlight unit BLU includes a light guiding member LGP-1, the light source LS, and the protection member PM.

According to some embodiments, a corner portion ED of the light guiding member LGP-1 has a chamfered shape. Thus, it is possible to prevent the corner portion ED of the light guiding member LGP-1 from breaking, even when an impact is exerted on the light guiding member LGP-1.

According to some embodiments, other elements, except for the afore-described elements, have substantially the same features as those of embodiments described with reference to FIG. 4A, and thus, detailed descriptions thereof will be omitted.

Referring to FIG. 4C, according to some embodiments, the backlight unit BLU includes the light guiding member LGP-1, the light source LS, and a protection member PM-1.

According to some embodiments, the protection member PM-1 has a shape that corresponds to the corner portion ED of the light guiding member LGP-1.

According to some embodiments, unlike the protection member PM of FIG. 4B, the protection member PM-1 of FIG. 4C is in direct contact with the corner portion ED of the light guiding member LGP-1 and prevents impacts from being exerted on the corner portion ED.

According to some embodiments, other elements, except for the afore-described elements, have substantially the same features as those of embodiments described with reference to FIGS. 4A and 4B, and thus, detailed descriptions thereof will be omitted.

Figure 5:
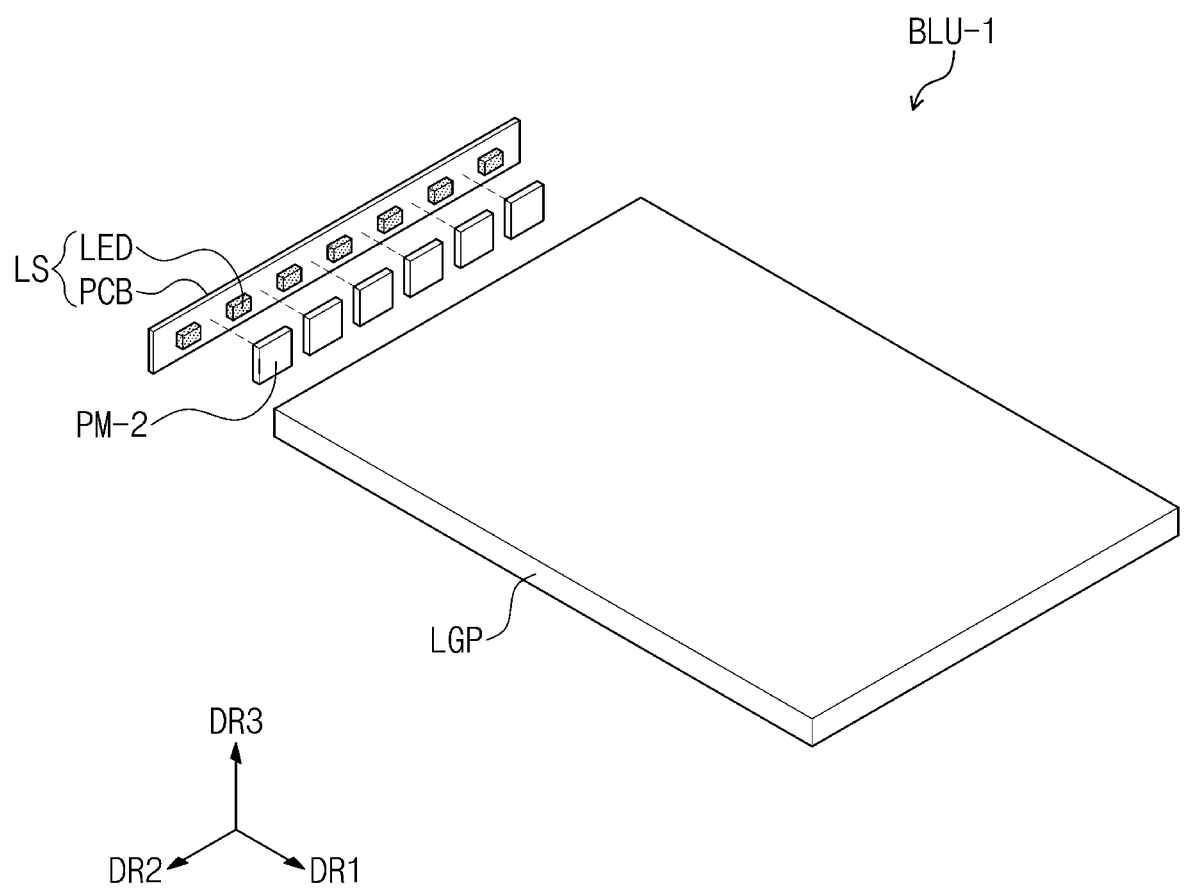
FIG. 5 is an exploded perspective view of a backlight unit according to some embodiments of the inventive concept.
Figure 6:
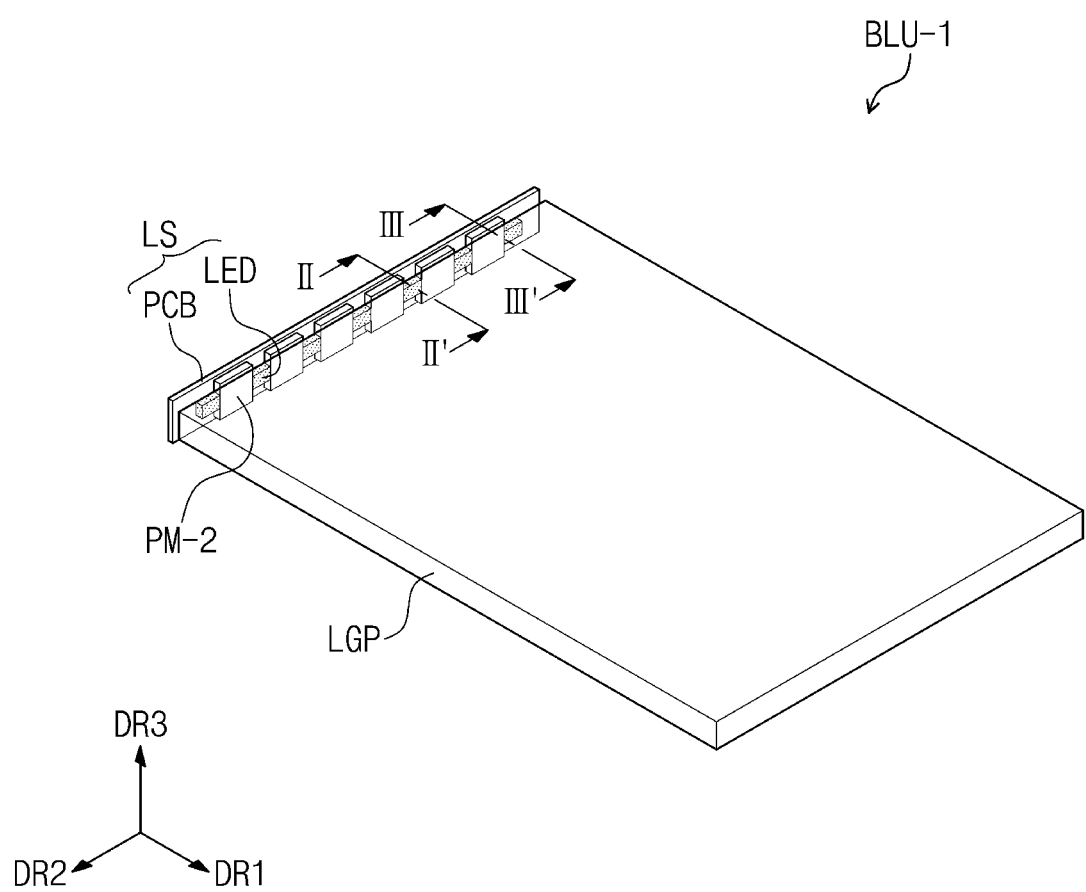
FIG. 6 is a perspective view of an assembled structure of a backlight unit of FIG. 5.

FIG. 5 is an exploded perspective view of a backlight unit BLU-1 according to some embodiments of the inventive concept. FIG. 6 is a perspective view of an assembled structure of a backlight unit BLU-1 of FIG. 5.

According to some embodiments, the backlight unit BLU-1 includes the light guiding member LGP, the light source LS, and a plurality of protection members PM-2.

According to some embodiments, the plurality of protection members PM-2 are disposed between the light guiding member LGP and the light source LS. Each of the protection members PM-2 is disposed between a corresponding adjacent pair of the light emitting diode packages LED.

FIG. 7 is a sectional view taken along line II-II' of FIG. 6. FIGS. 8A, 8B, 8C, and 8D are sectional views taken along line III-III' of FIG. 6.

Referring to FIG. 7, according to some embodiments, a length of the light emitting diode package LED measured in the first direction DR1 will be referred to as a reference length D-R. In the present specification, the reference length D-R will be referred to as a thickness of the light emitting diode package LED.

Figure 8A:
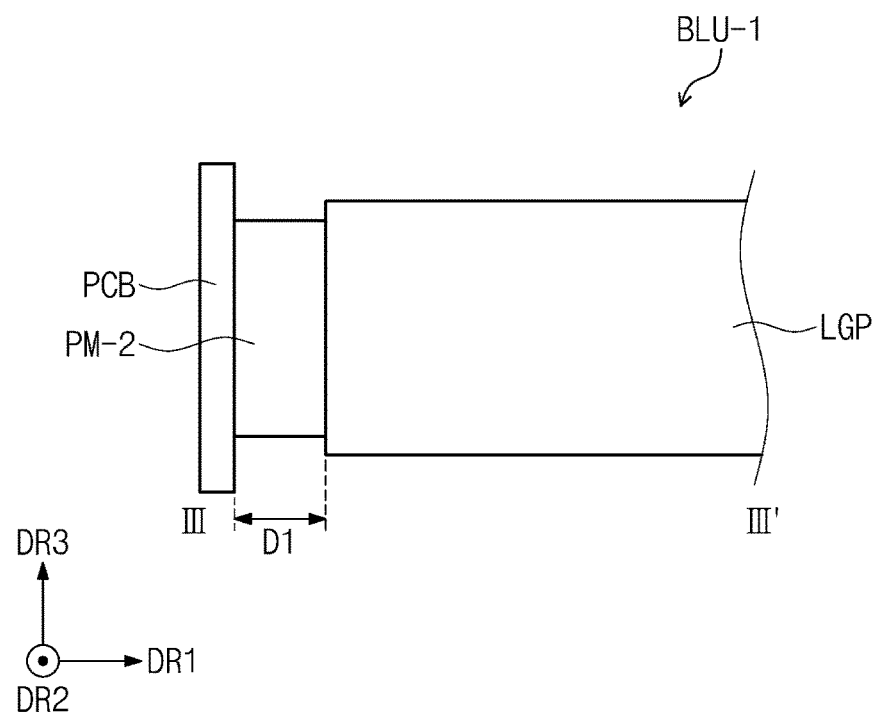
FIGS. 8A, 8B, 8C, and 8D are sectional views taken along line III-III' of FIG. 6.

Referring to FIG. 8A, according to some embodiments, when measured in the first direction DR1, the protection member PM-2 has a first length D1 that is substantially equal to the reference length D-R. In the present specification, the first length D1 will be referred to as a thickness of the protection member PM-2.

According to some embodiments, since the protection member PM-2 and the light emitting diode package LED have substantially the same thickness, the protection member PM-2 can disperse a stress exerted on the light emitting diode package LED.

In some embodiments, the protection members PM-2 are mounted on the printed circuit board PCB. Here, the mounting of the protection members PM-2 is performed using a surface mount technology (SMT).

In the following description, elements that are substantially the same as aforementioned elements will be referenced with the same numerals and detailed descriptions thereof will be omitted.

Figure 8B:
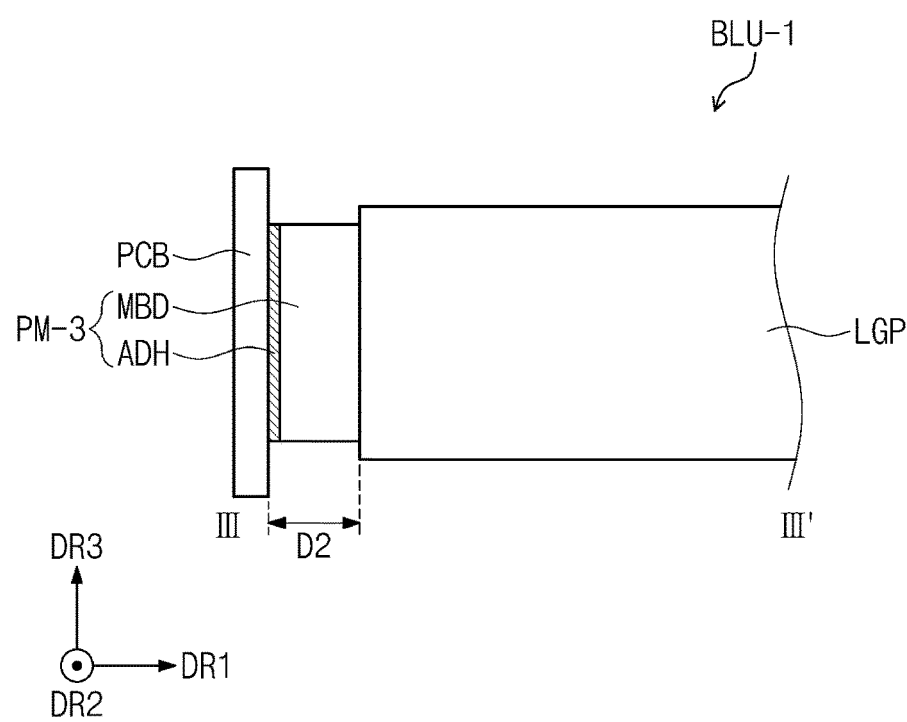

Referring to FIGS. 7 and 8B, according to some embodiments, the backlight unit BLU-1 includes the light guiding member LGP, the light source LS, and protection members PM-3.

According to some embodiments, when measured in the first direction DR1, each protection member PM-3 has a second length D2 that is substantially equal to the reference length D-R. In the present specification, the second length D2 will be referred to as a thickness of the protection member PM-3.

According to some embodiments, each protection member PM-3 includes a body portion MBD and an adhesive member ADH. The body portion MBD is in contact with the light guiding member LGP. The adhesive member ADH is used to adhere the body portion MBD to the printed circuit board PCB. The adhesive member ADH may be, for example, a pressure sensitive adhesive (PSA), but embodiments of the inventive concept are not limited thereto.

In the following description, elements that are substantially the same as aforementioned elements will be referenced with the same numerals and detailed descriptions thereof will be omitted.

Figure 8C:
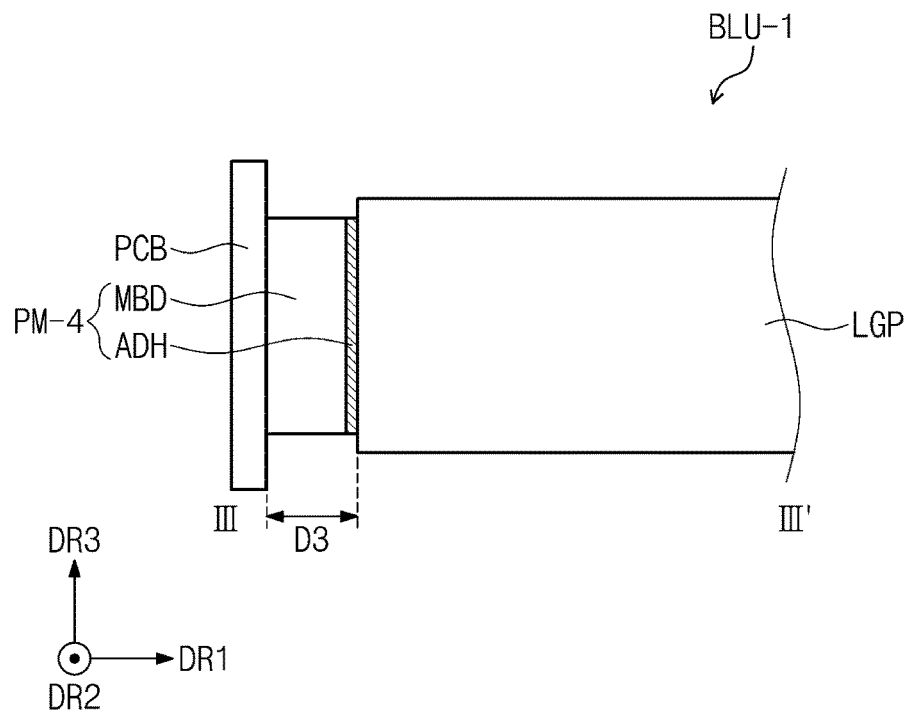

Referring to FIGS. 7 and 8C, according to some embodiments, the backlight unit BLU-1 includes the light guiding member LGP, the light source LS, and protection members PM-4.

According to some embodiments, when measured in the first direction DR1 each protection member PM-4 has a third length D3 that is substantially equal to the reference length D-R. In the present specification, the third length D3 will be referred to as a thickness of the protection member PM-4.

According to some embodiments, each protection member PM-4 includes the body portion MBD and the adhesive member ADH. The body portion MBD is in contact with the printed circuit board PCB. The adhesive member ADH is used to adhere the body portion MBD to the light guiding member LGP.

In the following description, elements that are substantially the same as aforementioned elements will be referenced with the same numerals and detailed descriptions thereof will be omitted.

Figure 8D:
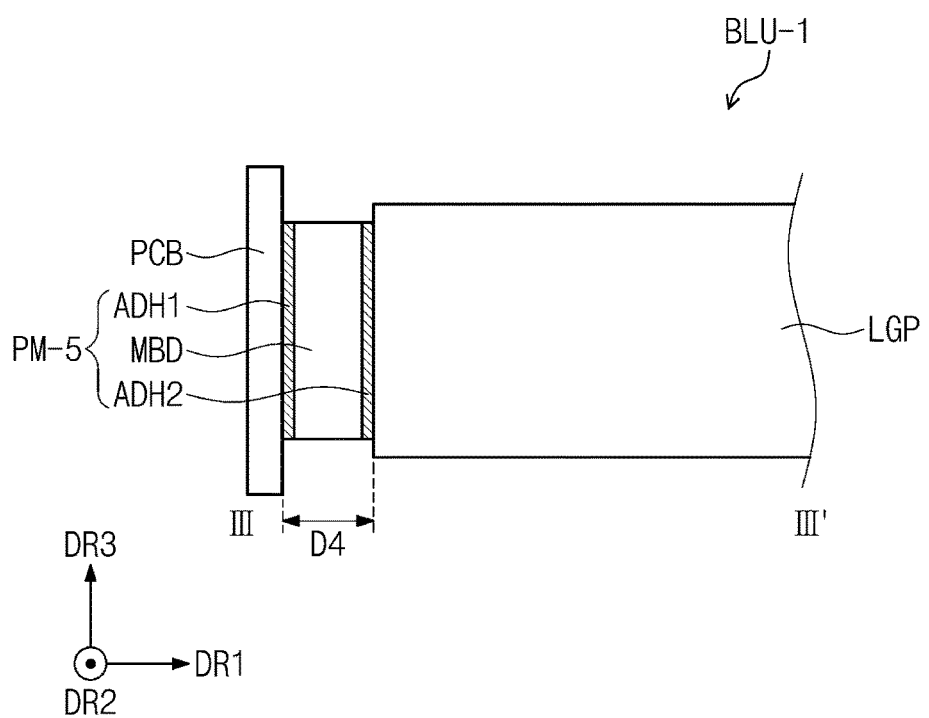

Referring to FIGS. 7 and 8D, according to some embodiments, the backlight unit BLU-1 includes the light guiding member LGP, the light source LS, and protection members PM-5.

According to some embodiments, when measured in the first direction DR1, each protection member PM-5 has a fourth length D4 that is substantially equal to the reference length D-R. In the present specification, the fourth length D4 will be referred to as a thickness of the protection member PM-5.

According to some embodiments, each protection member PM-5 includes the body portion MBD, a first adhesive member ADH1, and a second adhesive member ADH2. The body portion MBD is disposed between the printed circuit board PCB and the light guiding member LGP. The first adhesive member ADH1 is used to adhere the body portion MBD to the printed circuit board PCB. The second adhesive member ADH2 is used to adhere the body portion MBD to the light guiding member LGP.

In the following description, elements that are substantially the same as aforementioned elements will be referenced with the same numerals and detailed descriptions thereof will be omitted.

Referring to FIGS. 8B to 8D, according to some embodiments, the adhesive member ADH, the first adhesive member ADH1, and the second adhesive member ADH2 couple the printed circuit board PCB to the light guiding member LGP, and restrict the incident angles of light emitted from the light source LS into the light guiding member LGP. Thus, the optical efficiency of the backlight unit BLU-1 can be improved.

Figure 9:
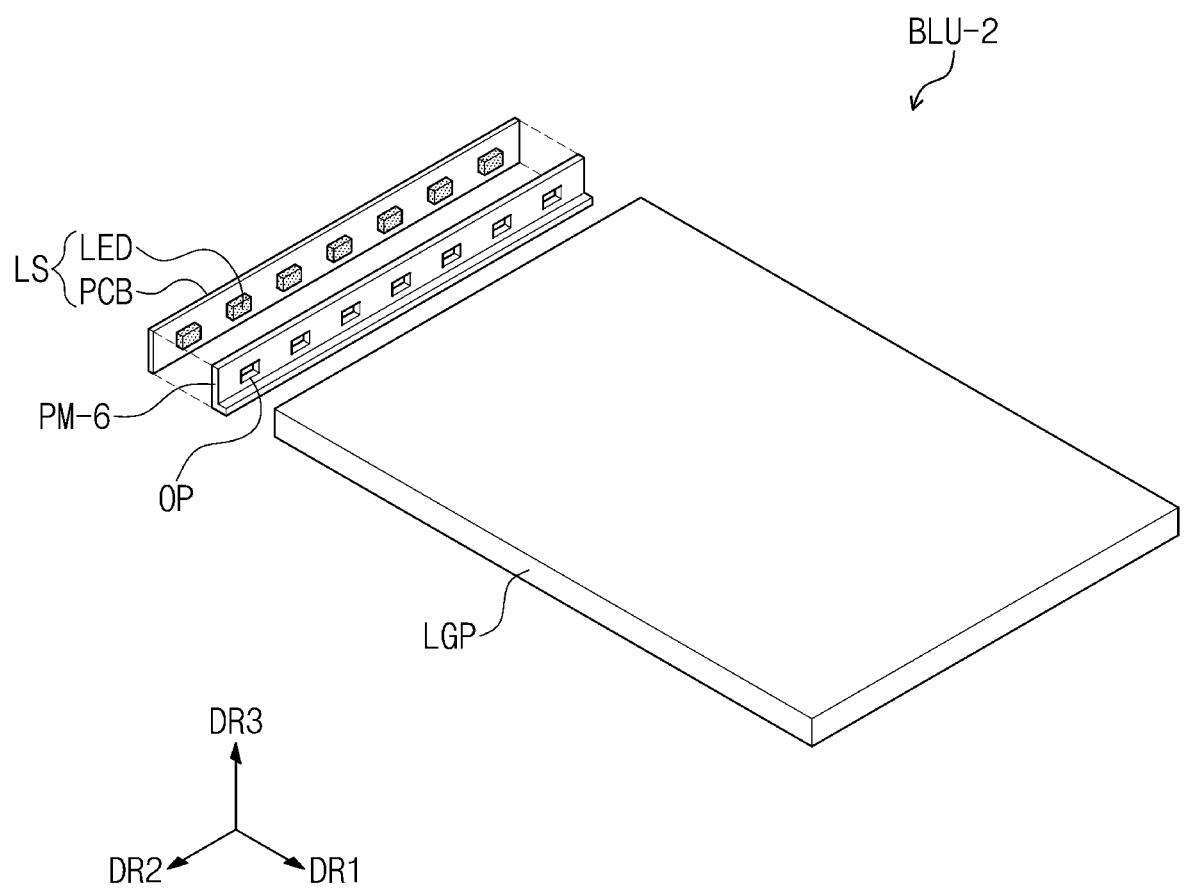
FIG. 9 is an exploded perspective view of a backlight unit according to some embodiments of the inventive concept.

FIG. 9 is an exploded perspective view of a backlight unit BLU-2 according to some embodiments of the inventive concept. FIG. 1 is a perspective view of an assembled structure of a backlight unit BLU-2 of FIG. 9.

According to some embodiments, the backlight unit BLU-2 includes the light guiding member LGP, the light source LS, and a protection member PM-6.

According to some embodiments, the protection member PM-6 is disposed between the light guiding member LGP and the light source LS.

Figure 10:
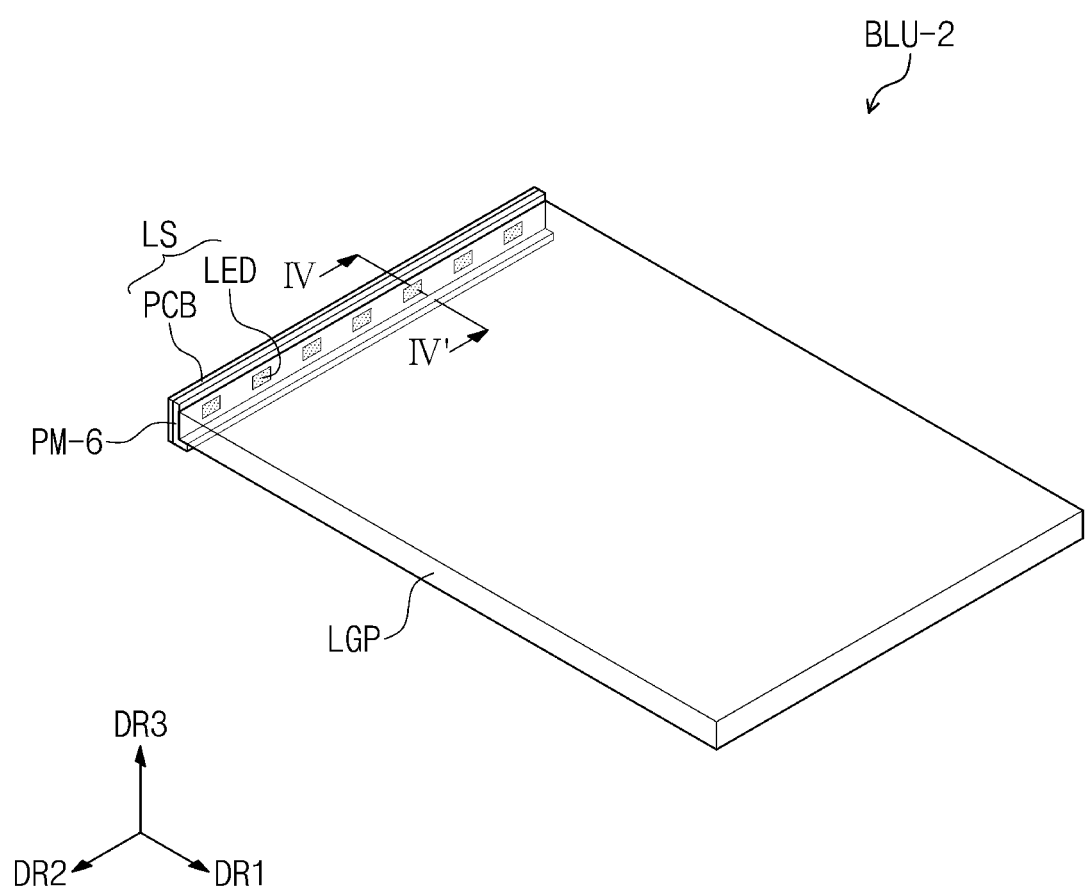
FIG. 10 is a perspective view of an assembled structure of a backlight unit of FIG. 9.
Figure 11:
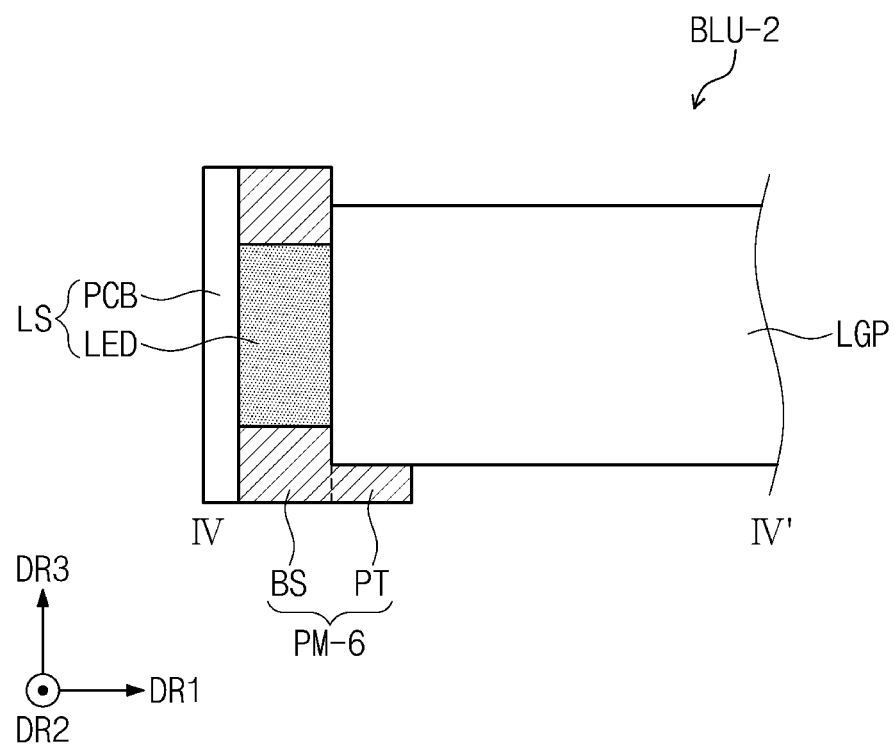
FIG. 11 is a sectional view taken along line IV-IV' of FIG. 10.

FIG. 11 is a sectional view taken along line IV-IV' of FIG. 10.

According to some embodiments, the protection member PM-6 includes a base BS and a support PT.

According to some embodiments, the base BS includes a plurality of openings OP. Each of the light emitting diode packages LED is inserted into a corresponding opening OP of the base BS. The base BS has substantially the same features as the protection member PM of FIG. 4A.

According to some embodiments, the support PT extends from a side portion of the base BS to support a bottom surface of the light guiding member LGP. In some embodiments, the support PT and the base BS are connected to each other to form a single object.

According to some embodiments, if the light guiding member LGP is thin, the light guiding member LGP may curve or bend. The support PT of the protection member PM-6 can prevent the light guiding member LGP from being curved or bent.

In the following description, elements that are substantially the same as aforementioned elements will be referenced with the same numerals and detailed descriptions thereof will be omitted.

Figure 12:
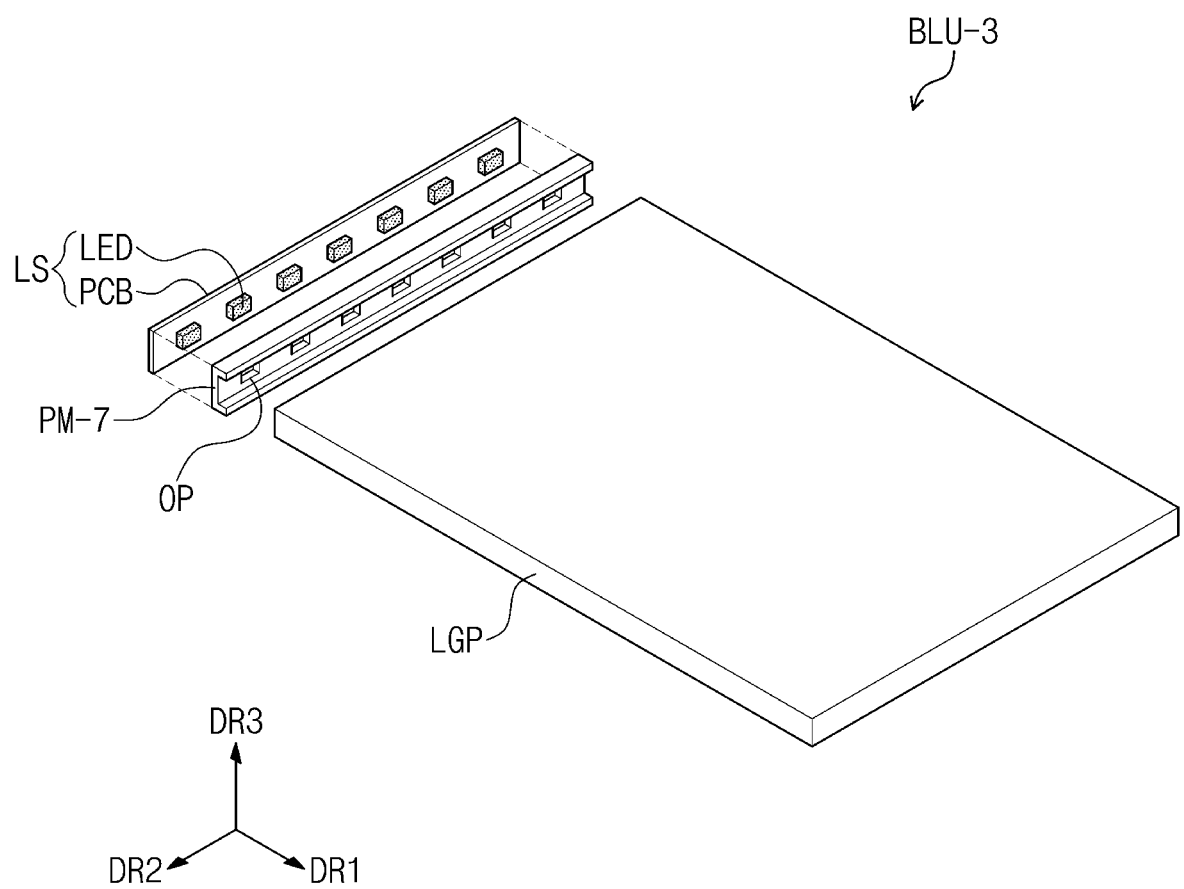
FIG. 12 is an exploded perspective view of a backlight unit according to some embodiments of the inventive concept.
Figure 13:
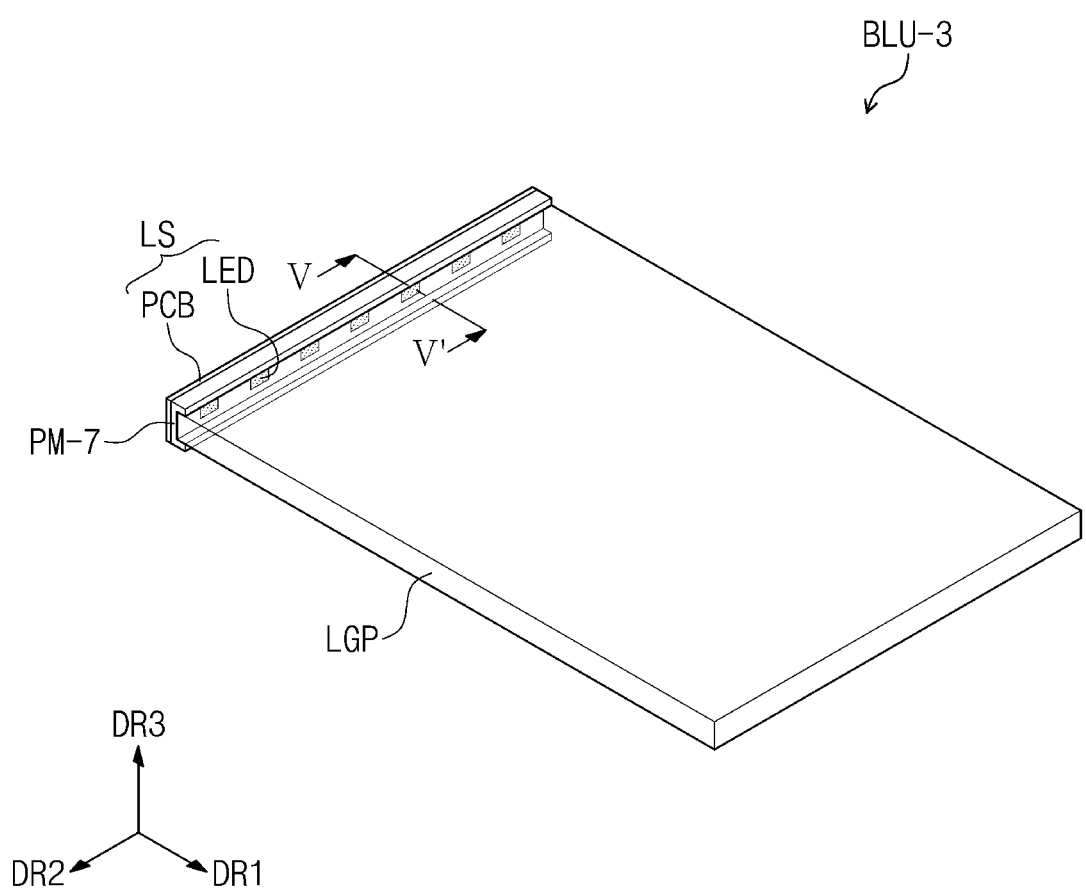
FIG. 13 is a perspective view of an assembled structure of a backlight unit of FIG. 12.

FIG. 12 is an exploded perspective view of a backlight unit BLU-3 according to some embodiments of the inventive concept. FIG. 13 is a perspective view of an assembled structure of a backlight unit BLU-3 of FIG. 12.

According to some embodiments, the backlight unit BLU-3 includes the light guiding member LGP, the light source LS, and a protection member PM-7.

According to some embodiments, the protection member PM-7 is disposed between the light guiding member LGP and the light source LS.

Figure 14:
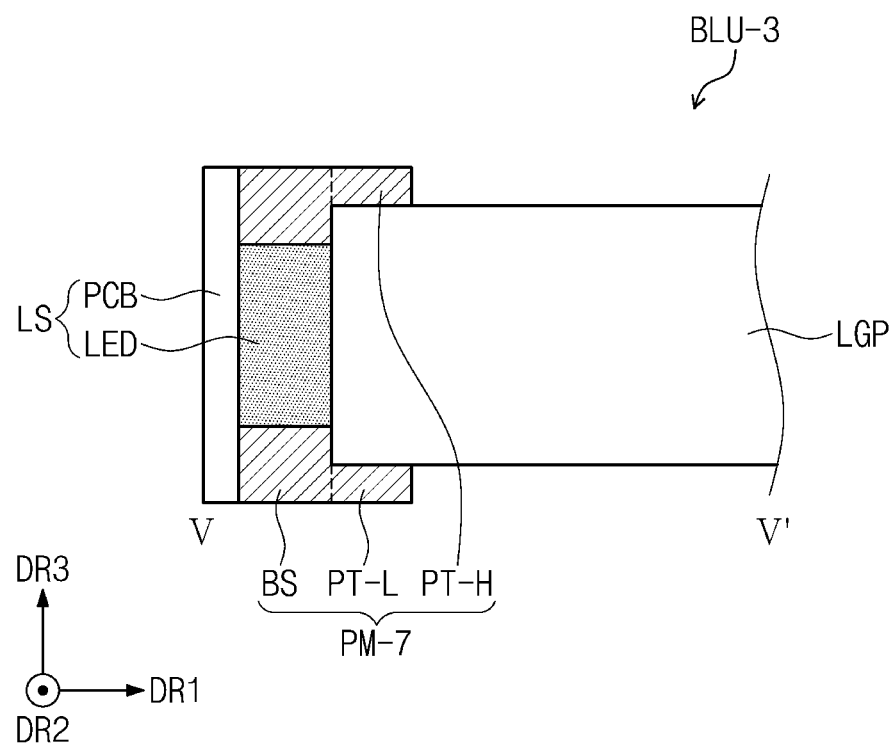
FIG. 14 is a sectional view taken along line V-V' of FIG. 13.

FIG. 14 is a sectional view taken along line V-V' of FIG. 13.

According to some embodiments, the protection member PM-7 includes the base BS, a lower support PT-L and an upper support PT-H.

According to some embodiments, the base BS includes a plurality of openings OP. Each of the light emitting diode packages LED is inserted into a corresponding opening OP of the base BS. The base BS has substantially the same features as the protection member PM of FIG. 4A.

According to some embodiments, the lower support PT-L extends from a side portion of the base BS and supports a bottom surface of the light guiding member LGP. In some embodiments, the lower support PT-L and the base BS are connected to each other to form a single object.

According to some embodiments, the upper support PT-H extends from a side portion of the base BS to contact a top surface of the light guiding member LGP. In some embodiments, the upper support PT-H and the base BS are connected to each other to form a single object.

According to some embodiments, the lower support PT-L and the upper support PT-H fix the light guiding member LGP.

In the following description, elements that are substantially the same as aforementioned elements will be referenced with the same numerals and detailed descriptions thereof will be omitted.

According to some embodiments of the inventive concept, it is possible to reduce stress exerted on a light source of a backlight unit. Thus, it is possible to prevent cracks from forming in the light source of the backlight unit.

According to some embodiments of the inventive concept, it is possible to precisely align the light source of the backlight unit with a light guiding member and thereby to reduce optical loss. This makes it possible to increase optical efficiency of the backlight unit.

While exemplary embodiments of the inventive concepts have been particularly shown and described, it will be understood by one of ordinary skill in the art that variations in form and detail can be made therein without departing from the spirit and scope of the attached claims.

What is claimed is:

1. A display device, comprising:
a display panel; and
a backlight unit that emits light to the display panel,
wherein the backlight unit comprises:
a light source that includes a printed circuit board and a plurality of light emitting diode packages mounted on an upper surface of the printed circuit board;
a light guiding member spaced apart from the printed circuit board with the plurality of light emitting diode packages therebetween; and
a protection member disposed on the upper surface of the printed circuit board,
wherein the plurality of light emitting diode packages and the protection member are in contact with the light guiding member and the upper surface of the printed circuit board.

2. The display device of claim 1, wherein a thickness of each of the light emitting diode packages is substantially equal to that of the protection member.

3. The display device of claim 1, wherein the protection member includes a plurality of openings, and
each of the light emitting diode packages is inserted into a corresponding opening.

4. The display device of claim 3, wherein the protection member comprises:
a base that includes the openings; and
a lower support that extends from a first side portion of the base, wherein the lower support supports a bottom surface of the light guiding member.

5. The display device of claim 4, wherein the base and the lower support constitute a single object.

6. The display device of claim 4, wherein the protection member further comprises an upper support that extends from a second side portion of the base and contacts a top surface of the light guiding member.

7. The display device of claim 6, wherein the base, the lower support, and the upper support constitute a single object.

8. The display device of claim 1, further comprising a plurality of protection members,
wherein each of the plurality of protection members is disposed between a corresponding adjacent pair of the light emitting diode packages.

9. The display device of claim 8, wherein at least one of the plurality of protection members is mounted on the printed circuit board.

10. The display device of claim 8, wherein at least one of the plurality of protection members comprises:
a body portion that is in contact with the light guiding member; and
an adhesive member that attaches the body portion to the printed circuit board.

11. The display device of claim 8, wherein at least one of the plurality of protection members comprises:
a body portion that is in contact with the printed circuit board; and
an adhesive member that attaches the body portion to the light guiding member.

12. The display device of claim 8, wherein at least one of the plurality of protection members comprises:
a body portion;
a first adhesive member that attaches the body portion to the printed circuit board; and
a second adhesive member that attaches the body portion to the light guiding member.

13. The display device of claim 1, wherein a corner portion of the light guiding member has a chamfered shape.

14. The display device of claim 13, wherein the protection member has a shape corresponding to the chamfered shape.

15. A backlight unit, comprising:
a light source that includes a printed circuit board and a plurality of light emitting diode packages mounted on the printed circuit board;
a glass light guiding member spaced apart from the printed circuit board with the plurality of light emitting diode packages therebetween; and
a protection member disposed between the glass light guiding member and the printed circuit board,
wherein a thickness of each of the light emitting diode packages is substantially equal to that of the protection member.

16. A backlight unit, comprising:
a light source that includes a printed circuit board and a plurality of light emitting diode packages mounted on an upper surface of the printed circuit board;
a light guiding member that includes a front surface and a rear surface that face each other and a plurality of side surfaces that connect the front surface to the rear surface, wherein at least one of the plurality of side surfaces faces the upper surface of the printed circuit board; and
a protection member disposed on the upper surface of the printed circuit board,
wherein the plurality of light emitting diode packages and the protection member are in contact with the at least one of the plurality of side surfaces of the light guiding member.

17. The backlight unit of claim 16, wherein the light guiding member receives light emitted from the light emitting diode packages through at least one of the plurality of side surface and emits the received light through the front surface.

18. The backlight unit of claim 17, wherein a length of one of the plurality of light emitting diode packages is substantially equal to that of the protection member.

19. The backlight unit of claim 18, wherein the protection member includes a plurality of openings, and
- each of the light emitting diode packages is inserted into a corresponding opening.

20. The backlight unit of claim 18, further comprising a plurality of protection members, and
- each of the plurality of protection members is disposed between a corresponding adjacent pair of the plurality of light emitting diode packages.

\* \* \* \* \*